US010366743B1

(12) United States Patent
Ho et al.

(10) Patent No.: US 10,366,743 B1
(45) Date of Patent: Jul. 30, 2019

(54) MEMORY WITH A REDUCED ARRAY DATA BUS FOOTPRINT

(71) Applicant: Micron Technology, Inc., Boise, ID (US)

(72) Inventors: Michael V. Ho, Allen, TX (US); Byung S. Moon, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/976,716

(22) Filed: May 10, 2018

(51) Int. Cl.
  G11C 11/24    (2006.01)
  G11C 11/4096  (2006.01)
  G11C 11/4094  (2006.01)
  G11C 11/4076  (2006.01)
  G11C 11/4093  (2006.01)

(52) U.S. Cl.
  CPC ...... *G11C 11/4096* (2013.01); *G11C 11/4076* (2013.01); *G11C 11/4093* (2013.01); *G11C 11/4094* (2013.01)

(58) Field of Classification Search
  CPC .... G11C 5/04; G11C 5/02; G11C 8/18; G11C 7/10; G11C 2207/2254; G11C 29/023; G11C 29/028; G11C 29/14; G11C 5/025; G11C 7/1072; G11C 8/12; G11C 7/1045

USPC .... 365/230.03, 230.06, 189.04, 200, 189.14, 365/230.01, 233.1, 185.11, 189.05, 201, 365/226, 230.08, 63, 189.011
See application file for complete search history.

(56) References Cited

U.S. PATENT DOCUMENTS

2015/0089164 A1* 3/2015 Ware ................. G11C 5/02
                                              711/149

* cited by examiner

*Primary Examiner* — Thong Q Le
(74) *Attorney, Agent, or Firm* — Perkins Coie LLP

(57) ABSTRACT

Memory devices and systems in which array data lines of a local data bus are shared between two or more memory bank groups in a memory array. In one embodiment, a memory device is provided, comprising a memory array, I/O gating circuitry, and a local data bus. The local data bus can include a plurality of array data lines shared between two or more memory bank groups of the memory array. The local data bus can electrically couple and transfer data between the two or more memory bank groups and the I/O gating circuitry. In some embodiments, one or more data latches can be electrically coupled to the local data bus to (i) transfer data off the local data bus to free the plurality of data lines for subsequent data transfers and/or (ii) match varying data propagation timings on the local data with column generations of the memory bank groups.

19 Claims, 5 Drawing Sheets

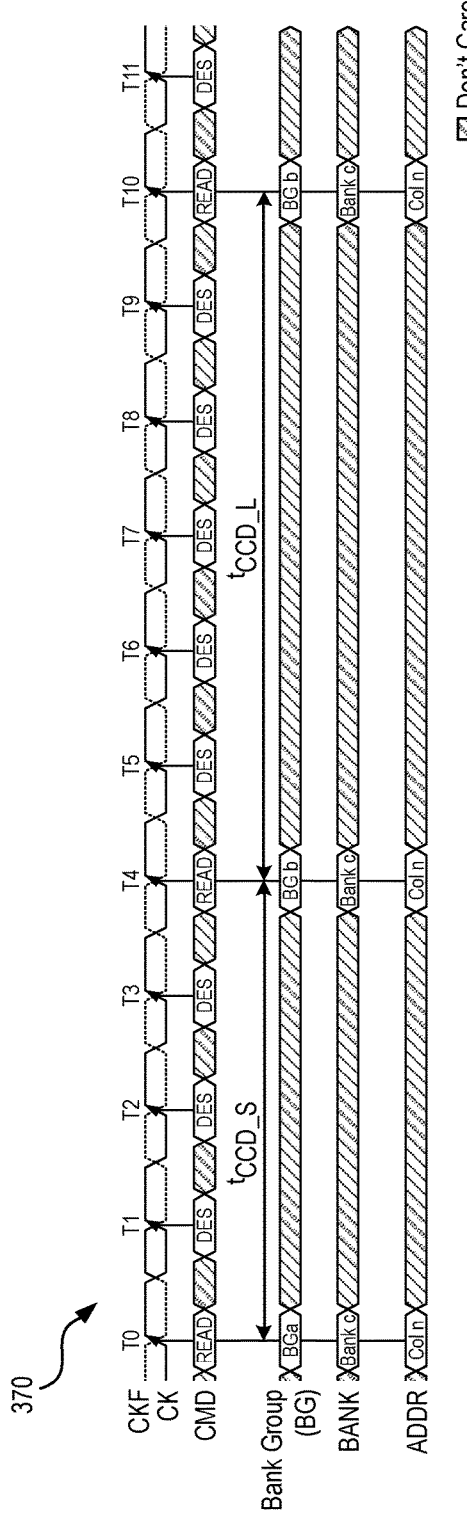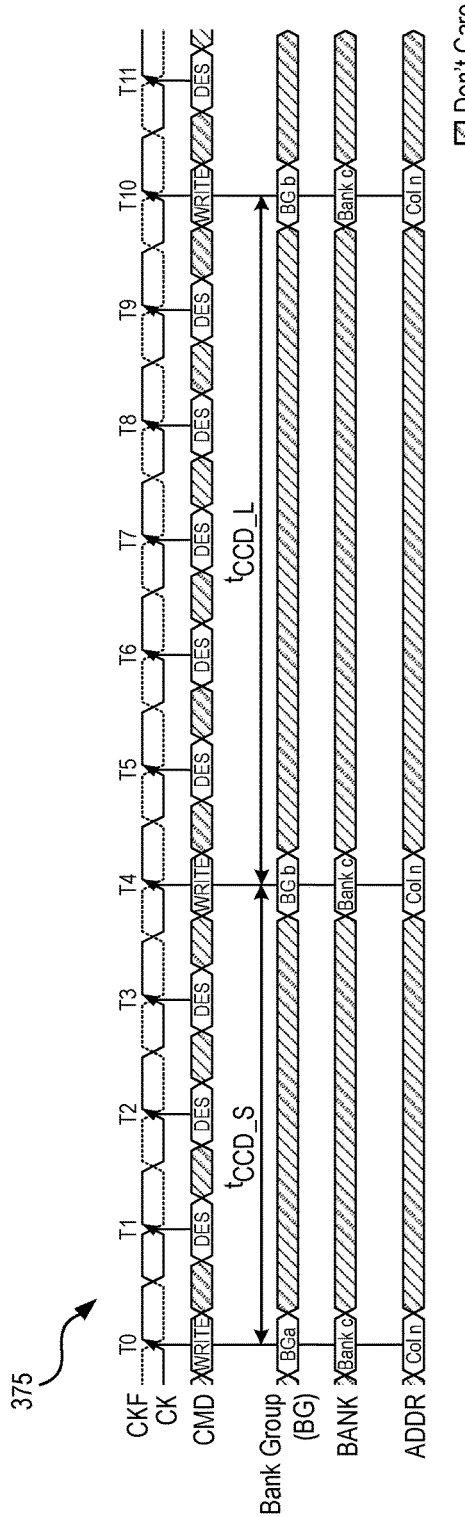

US 10,366,743 B1

MEMORY WITH A REDUCED ARRAY DATA BUS FOOTPRINT

TECHNICAL FIELD

The present disclosure is related to memory systems and devices. In particular, the present disclosure is related to memory systems and devices with a reduced data path footprint.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR), phase change memory (PCM), ferroelectric random access memory (FeRAM), resistive random access memory (RRAM), and magnetic random access memory (MRAM), among others.

Improving memory devices, generally, may include increasing memory cell density, increasing read/write speeds or otherwise reducing operational latency, increasing reliability, increasing data retention, reducing power consumption, or reducing manufacturing costs, among other metrics. One such other metric is reducing the size or footprint of the memory devices and/or components of the memory devices. Many manufacturers achieve size reduction through scaling. Manufacturers can also achieve size reduction through various architectural decisions and/or logic optimizations.

BRIEF DESCRIPTION OF THE DRAWINGS

FIGS. 3A and 3B are timing diagrams of read-to-read and write-to-write sequences, respectively, of same bank group versus different bank group access operations on a memory device, such as a memory device configured in accordance with an embodiment of the present technology.

DETAILED DESCRIPTION

Figure 1:
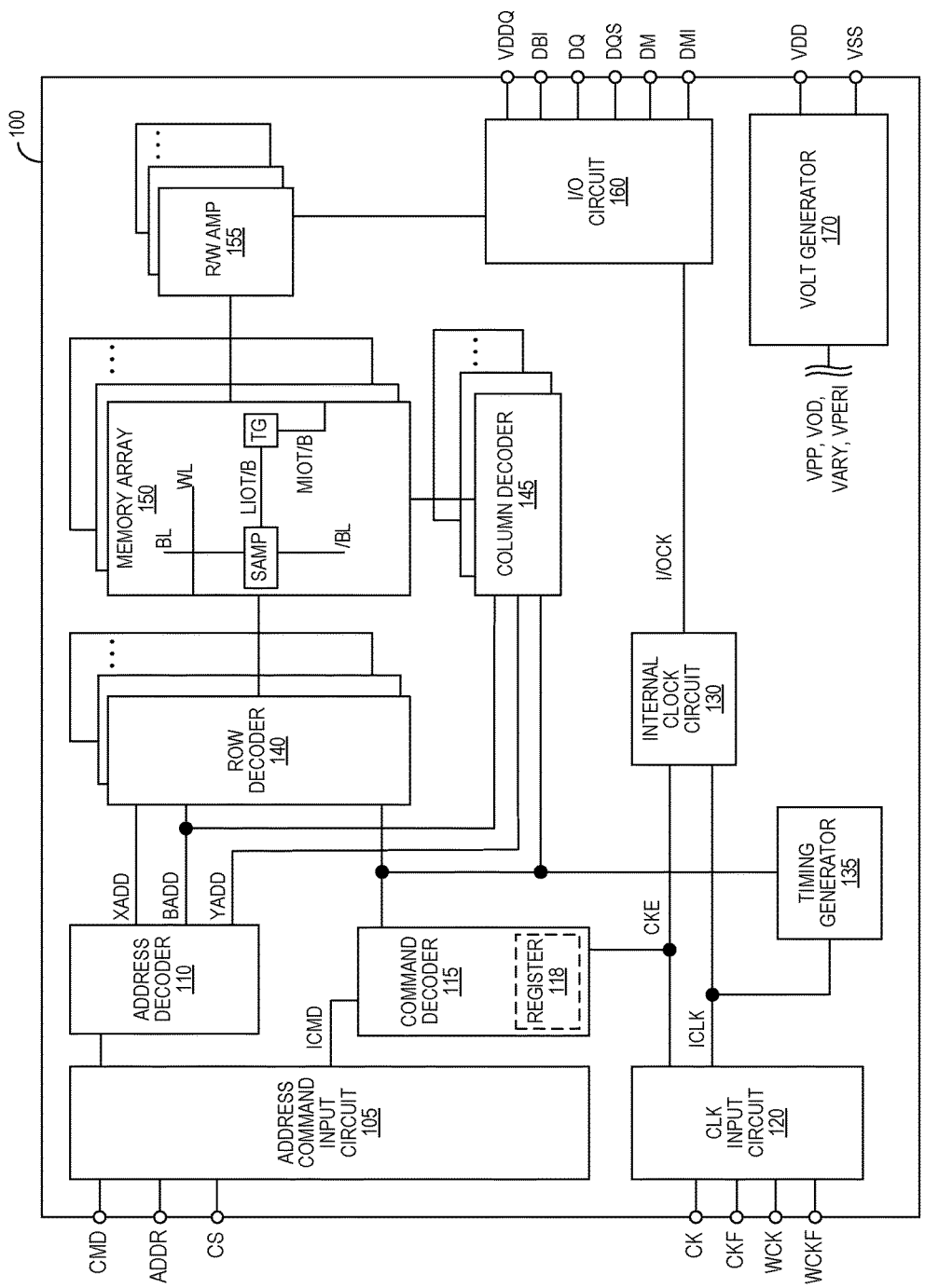
FIG. 1 is a block diagram schematically illustrating a memory device configured in accordance with an embodiment of the present technology.

As discussed in greater detail below, the technology disclosed herein relates to memory systems and devices with a reduced data path footprint. A person skilled in the art, however, will understand that the technology may have additional embodiments and that the technology may be practiced without several of the details of the embodiments described below with reference to FIGS. 1-5. In the illustrated embodiments below, the memory devices and systems are primarily described in the context of devices incorporating DRAM storage media. Memory devices configured in accordance with other embodiments of the present technology, however, can include other types of memory devices and systems incorporating other types of storage media, including PCM, SRAM, FRAM, RRAM, MRAM, read only memory (ROM), erasable programmable ROM (EPROM), electrically erasable programmable ROM (EEPROM), ferroelectric, magnetoresistive, and other storage media, including non-volatile, flash (e.g., NAND and/or NOR) storage media.

Several memory devices (e.g., DRAM memory devices) use a plurality of local data buses to transfer data from input/output (I/O) gating circuitry to memory banks in a memory array. Each of the local data buses may be dedicated to a memory bank group comprising two or more of the memory banks in the memory array. The dedicated local data buses allow the memory devices to quickly execute sequences of access operations (e.g., read-to-read and/or write-to-write sequences of operations) to different memory bank groups without the concern that data transferred over one local data bus will collide with and/or corrupt data transferred over another local data bus. Each of the dedicated local data buses, however, includes a plurality of array data lines, meaning that the plurality of local data buses requires a large amount of space on each memory device.

As described in greater detail below, memory devices configured in accordance with embodiments of the present technology include at least one local data bus shared between two or more memory bank groups in a memory array of the device. Thus, the total amount and footprint of local data buses on the memory device is reduced. In addition, in some embodiments of the present technology, the memory device can include data latches electrically coupled to the shared local data buses. The data latches can be configured to transfer data off of the shared local data buses (i) to free up the local data buses for subsequent data transfers and (ii) to prevent data corresponding to one data transfer from colliding with and/or corrupting data corresponding to a subsequent data transfer and sent over the same local data bus. In these embodiments, the memory device can use the data latches to optimize and/or match column select generations of the memory bank groups with various data propagation timings that occur on each local data bus due to different distances between the I/O gating circuitry of the memory device and the memory bank groups coupled to the local data bus. In some embodiments, the optimization and/or matching allows the memory device to adhere to conventional timing specifications for access operations, thereby preventing and/or minimizing a decrease in device performance despite the decrease in the amount of available array data lines on the device.

FIG. 1 is a block diagram schematically illustrating a memory device 100 configured in accordance with an embodiment of the present technology. The memory device 100 can be connected to any one of a number of electronic devices capable of utilizing memory for temporary or persistent storage of information, or a component thereof. For example, a host device of the memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100, although in other embodiments, the host device may be indirectly connected to memory device (e.g., over a networked connection or through intermediary devices).

As shown in FIG. 1, the memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK, CKF, WCK, and WCKF, data terminals DQ, DQS, DBI, DM, and DMI, and power supply terminals VDD, VSS, VDDQ, and/or VSSQ.

As shown in FIG. 1, the clock terminals may be supplied with external clock signals and complementary external clock signals. The external clock signals CK, CKF, WCK, and WCKF can be supplied to a clock input circuit 120. The CK and CKF signals and the WCK and WCKF signals can be complementary. Complementary clock signals can have opposite clock levels and transition between the opposite clock levels at the same time. For example, when a clock signal is at a low clock level, a complementary clock signal is at a high level; and when the clock signal is at a high clock level, the complementary clock signal is at a low clock level. Moreover, when the clock signal transitions from the low clock level to the high clock level, the complementary clock signal transitions from the high clock level to the low clock level; and when the clock signal transitions from the high clock level to the low clock level, the complementary clock signal transitions from the low clock level to the high clock level.

Input buffers included in the clock input circuit 120 can receive the external clock signals. For example, when enabled by a CKE signal from command decoder 115, an input buffer can receive the CK and CKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable signal CKE from command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (I/O) clock signals I/OCK. The I/O clock signals I/OCK can be supplied to I/O circuit 160 and can be used as a timing signal for determining an output timing of read data and the input timing of write data. The I/O clock signals I/OCK can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The command terminals and address terminals may be supplied with an address signal and a bank address signal from outside. The address signal and the bank address signal supplied to the address terminals can be transferred, via the command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145. A bank group BG signal and/or a memory bank signal BANK can be included in or generated from the bank address signal BADD.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to the command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command. The command decoder 115 may further include one or more registers 118 for tracking various counts or values.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in row decoder 140, the internal potentials VOD and VARY can be used in sense amplifiers included in memory array 150, and the internal potential VPERI can be used in many other circuit blocks.

The power supply terminal may also be supplied with power supply potential VDDQ and/or VSSQ. The power supply potential VDDQ can be supplied to input/output (I/O) circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

When a read command is issued and a column address is timely supplied with the read command, read data can be read from memory cells in the memory array 150 designated by a row address and the column address. The read command may be received by the command decoder 115, which can provide internal commands to the I/O circuit 160 so that read data can be output from data terminals via read/write amplifiers 155 and the I/O circuit 160. More specifically, the read data can be output via the read/write amplifiers 155 and I/O gating (not shown) onto global data lines of an internal data bus (not shown). The global data lines of the internal data bus can transfer the read data through a read FIFO, a data mux, read drivers and/or through other circuits and/or components (not shown) of the I/O circuit 160 to the data terminals DQ, DM, DQS, DBI, and/or DMI according to the I/OCK clock signal.

The read data may be provided at a time defined by read latency information that can be programmed in the memory device 100, for example, in a mode register (not shown). The read latency information can be defined in terms of clock cycles of the clock signal CK. For example, the read latency information can be a number of clock cycles of the clock signal CK after the read command is received by the memory device 100 when the associated read data is provided.

When a write command is issued and a column address is timely supplied with the command, write data can be supplied to the data terminals DQ, DQS, DM, DBI, and/or DMI according to the I/OCK clock signal. The write command may be received by the command decoder 115, which can provide internal commands to the I/O circuit 160 so that the write data can be received by data receivers in the input/output circuit 160, and supplied via the input/output circuit 160 and the read/write amplifiers 155 to the memory array 150. More specifically, the write data can be transferred via the global data lines of the internal data bus through input logic, a write FIFO, write drivers and/or other circuits and/or components (not shown) of the I/O circuit 160, through I/O gating (not shown), and/or through the read/write amplifiers 155 to the memory array 150.

The write data may be written in the memory cell designated by a row address and the column address. The write data may be provided to the data terminals at a time that is defined by write latency information. The write latency information can be programmed in the memory device 100, for example, in the mode register. The write latency information can be defined in terms of clock cycles of the CK clock signal. For example, the write latency information can be a number of clock cycles of the CK signal after the write command is received by the memory device 100 when the associated write data is received.

Figure 2:
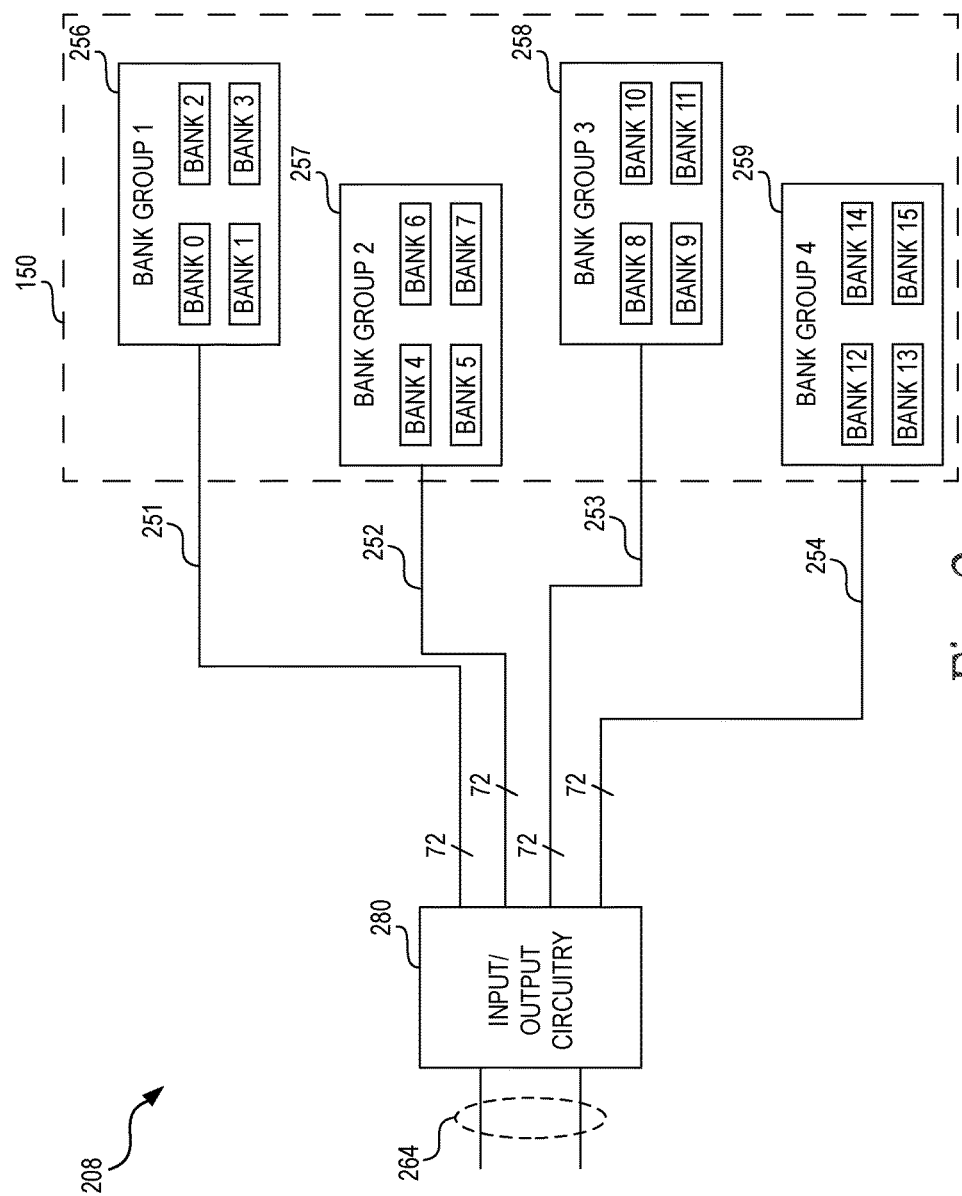
FIG. 2 is a block diagram schematically illustrating a portion of an input/output data path in a memory device.

FIG. 2 is a block diagram schematically illustrating a portion of an input/output data path 208 in a memory device. Well-known structures and functions of the data path 208 have not been shown or described in detail in FIG. 2 to avoid unnecessarily obscuring particular aspects of the present technology. As shown, the data path 208 includes an internal data bus 264, input/output (I/O) gating circuitry 280, local data buses 251-254, and memory banks 0-15. The internal data bus 264 includes a plurality of bi-directional global data lines (not shown). The global data lines can include global I/O data lines, global data mask lines, and the like. In operation, the internal data bus 264 is configured to transfer data to and/or from the I/O gating circuitry 280 from and/or to data terminals (not shown) of the memory device, respectively.

The I/O gating circuitry 280 of the memory device can include one or more global circuits (e.g., global I/O gating circuitry) and/or can include other local circuits, such as local I/O gating circuitry. In operation, the local and/or global circuits in the I/O gating circuitry 280 are configured to align and route data to and/or from one or more of the memory banks 0-15 in the memory array 150 from and/or to the data terminals DQ (not shown) of the memory device, respectively. For example, when data is written to the memory device, the data is transferred from the data terminals DQ to the I/O gating circuitry 280 via the internal data bus 264. The I/O gating circuitry 280 can then align and route the data to one or more of the memory banks 0-15 in the memory array 150 via one or more of the local data buses 251-254.

As shown in FIG. 2, the memory banks 0-15 of the memory array 150 are arranged in memory bank groups 256-259. In particular, each of the memory bank groups 256-259 includes four of the memory banks 0-15 and is electrically coupled to the I/O gating circuitry 280 via one of the local data buses 251-254. The memory bank groups 256-259 are separate entities and each includes local circuitry (not shown) to access (e.g., in parallel and/or in serial) words of data from their respective memory banks separately (e.g., independently) from the memory banks of other memory bank groups. Although four memory bank groups of four memory banks are illustrated in FIG. 2, other memory devices can include a greater or lesser number of memory bank groups and/or a greater or lesser number of memory banks per memory bank group.

The local data buses 251-254 include bi-directional data lines similar to the global data lines of the internal data bus 254. More specifically, each of the local data buses 251-254 includes 64 array I/O data lines and 8 data mask lines (e.g., one data mask line per 8 array I/O data lines). As discussed above, the local data buses 251-254 are each configured to transfer data to and/or from one of the memory bank groups 256-259 from and/or to the I/O gating circuitry 280, respectively.

FIGS. 3A and 3B are timing diagrams 370 and 375 of read-to-read and write-to-write sequences, respectively, of same bank group versus different bank group access operations on a memory device, such as a memory device 100 configured in accordance with an embodiment of the present technology. As shown, the timing delay between access (e.g., read or write) operations on the same memory bank group is different from the timing delay between access operations on different memory bank groups. For example, a memory device can access (e.g., read (FIG. 3A) and/or write (FIG. 3B)) memory banks in a memory bank group BGb a time delay $t_{CCD\_S}$ after accessing memory banks in a different memory bank group BGa. In some embodiments, the timing delay $t_{CCD\_S}$ can be equivalent to "n" number of cycles (e.g., 4-8 clock cycles) of the clock signal CK. In contrast, the memory device can access the memory banks in the memory bank group BGb a time delay $t_{CCD\_L}$ after accessing the memory banks in the same memory bank group BGb. In some embodiments, the timing delay $t_{CCD\_L}$ can be equivalent to "2n" number of cycles (e.g., 8-16 clock cycles) of the clock signal CK. Thus, the memory device can access different bank groups using a short timing specification between access commands, while the memory device can access the same bank group using a long timing specification between access commands.

One reason for the difference in timing specifications is the architecture of the memory device. Referring to FIG. 2, for example, each of the memory bank groups 256-259 is connected to the I/O gating circuitry 280 via a different one of the local data buses 251-254. Thus, when the memory device performs a read-to-read or a write-to-write sequence of access operations on different memory bank groups (e.g., the memory bank groups 256 and 257), the memory device illustrated in FIG. 2 can use different local data buses (e.g., the local data buses 251 and 252) without concern that data transferred to and/or from one of the memory bank groups will collide with and/or corrupt data transferred to and/or from the other memory bank group. In contrast, when accessing the same memory bank group (e.g., the memory bank group 256), only one local data bus (e.g., the local data bus 251) is available. Thus, to prevent data collision and/or corruption on the local data bus, the memory device must allow a greater amount of time for first data to transfer over and be latched off of the local data bus before the memory device can transfer second data over the same local data bus. For read-to-write and/or for write-to-read sequences of access operations, the memory device can similarly use a longer timing specification. This is because, regardless of whether the memory device accesses the same or different memory bank groups, all data transferred over the local data buses (e.g., the local data buses 251-254) during a write and/or read operation must be latched off of the local data buses before the memory device can transition to executing a read and/or write operation, respectively, using the local data buses.

Accordingly, separating the array I/O data lines and the array data mask lines such that each memory bank group in the memory device has its own local data bus facilitates easy data transfer during access operations, especially when accessing different memory bank groups. As discussed above, however, each of the local data buses includes 64 array I/O data lines and 8 data mask lines. Thus, the 256 array data lines and the 32 array data mask lines have a relatively large footprint, which limits size reduction of the memory device.

Figure 4:
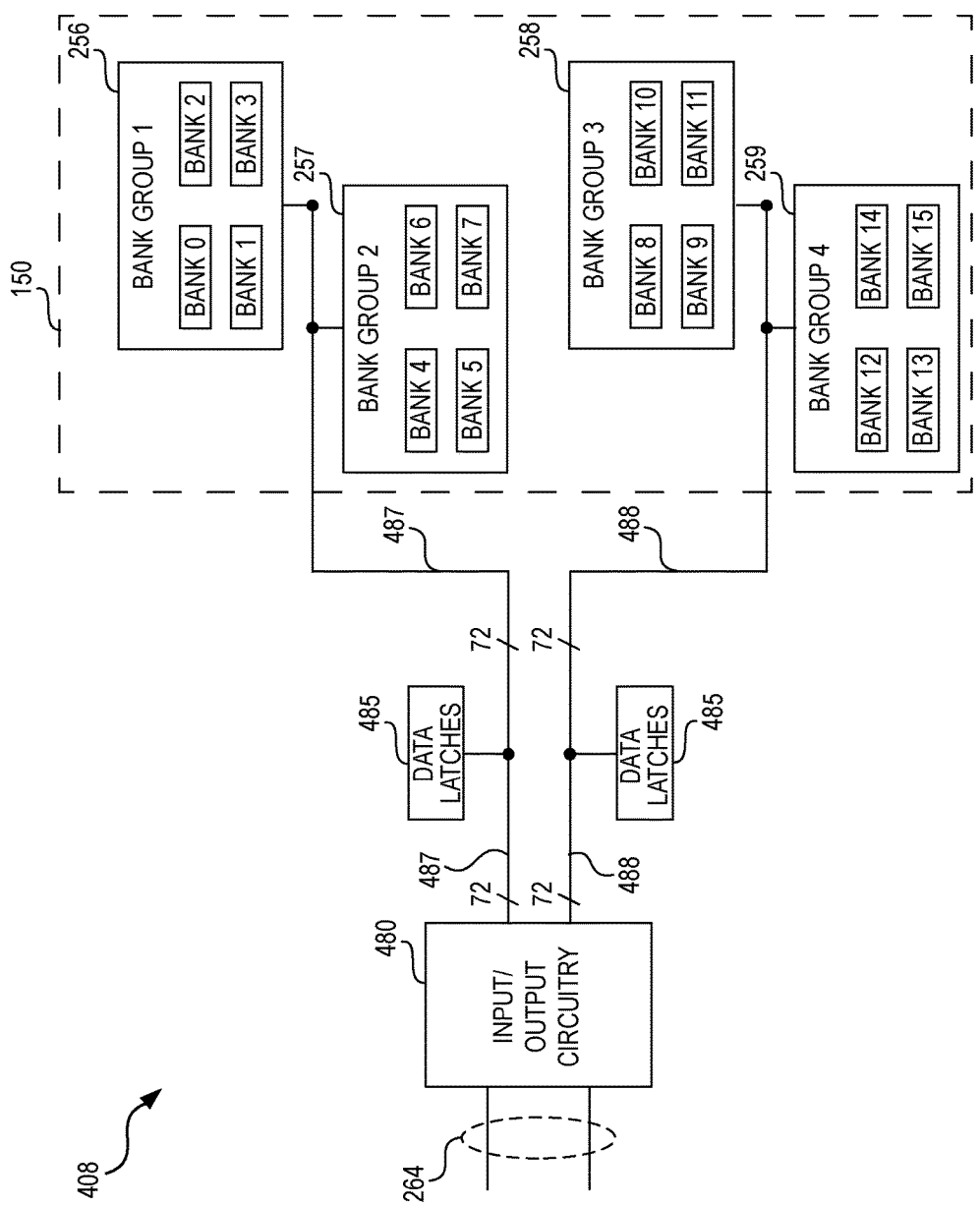
FIG. 4 is a block diagram schematically illustrating a portion of an input/output data path in a memory device configured in accordance with an embodiment of the present technology.

FIG. 4 is a block diagram schematically illustrating a portion of an input/output data path 408 in a memory device (e.g., the memory device 100 shown in FIG. 1) configured in accordance with an embodiment of the present technology. Well-known structures and functions of the data path 408 have not been shown or described in detail in FIG. 4 to avoid unnecessarily obscuring particular aspects of the present technology. As shown, the data path 408 is similar to the data path 208 illustrated in FIG. 2. The data path 408 illustrated in FIG. 4, however, includes two (as opposed to four) local data buses 487 and 488 that are shared between the memory bank groups 256 and 257 and the memory bank groups 258 and 259, respectively. Each of the local data buses 487 and 488 include 64 array I/O data lines and 8 array data mask lines, for a total of 144 data lines. Thus, the portion of the data path 408 between I/O gating circuitry 480 of the memory device 100 and the memory bank groups 256-259 includes half the amount of data lines as the portion of the data path 208 shown in FIG. 2, meaning that the footprint of this portion of the data path 408 is significantly smaller than the footprint of the portion of the data path 208 illustrated in FIG. 2.

As shown in FIG. 4, the memory bank groups 256 and 258 are located farther from the I/O gating circuitry 480 than the bank groups 257 and 259. As a result, data propagation timings on each of the local data buses 487 and 488 to different memory bank groups and/or to different memory banks within a memory bank group vary. For example, there is a larger data propagation timing for data transfers to and/or from the memory bank group 256 on the local data bus 487 than the data propagation timing for data transfers to and/or from the memory bank group 257 on the local data bus 487. Similarly, there is a larger data propagation timing for data transfers to and/or from the memory bank group 258 on the local data bus 488 than the data propagation timing for data transfers to and/or from the memory bank group 259 on the local data bus 488.

The varying data propagation timings over the local data buses 487 and 488 are a concern for sequences of access operations with shorter timing specifications (e.g., the timing delay $t_{CCD\_S}$). These sequences of access operations include read-to-read and/or write-to-write sequences of access operations between different memory bank groups on the same local data bus, as shown in FIGS. 3A and 3B, respectively. In contrast with the portion of the data path 208 shown in FIG. 2, the portion of the data path 408 illustrated in FIG. 4 does not include a dedicated local data bus for each of the memory bank groups 256-259. Thus, there is an increased risk of data transferred during an access operation colliding with and/or corrupting data transferred on the same local data bus during a consecutive access operation unless an adequate amount of time is provided to transfer data off of the local data buses 487 and/or 488 before executing the consecutive access operation. This risk is magnified as the frequency of the clock signal CK increases and the timing delay $t_{CCD\_S}$ decreases.

To adhere to the timing specifications discussed above with respect to FIGS. 3A and 3B, the data path 408 in some embodiments can include one or more flip flops or data latches 485 electrically coupled to the local data buses 487 and/or 488 between the I/O gating circuitry 480 and the memory banks 0-15. In operation, the memory device 100 can use the data latches 485 to optimize and/or match (i) column select generations for near and far memory bank groups on the same local data bus with (ii) varying data propagation timings on the local data bus. For example, the data latches 485 can be configured to quickly transfer data off of the local data buses 487 and/or 488 (e.g., isolate the data) to free up the local data buses 487 and/or 488 for a subsequent data transfer. In some embodiments, one or more of the data latches 485 can be located between the I/O gating circuitry 480 and the memory array 150 (e.g., at the edge of the memory array 150) to transfer data off of the local data buses 487 and/or 488 shortly after (e.g., as soon as) the data exits the memory array 150 (e.g., during a write operation). In these and other embodiments, one or more of the data latches 485 can be located proximate to one or more of the memory bank groups 256-259 and/or to one or more of the memory banks 0-15 within the memory array 150 to transfer data off of the local data buses 487 and/or 488 shortly after (e.g., as soon as) the data arrives at the memory bank groups 256-259 and/or at the memory banks 0-15 (e.g., during a read operation).

Because the timing delay $t_{CCD\_S}$ is the shortest timing specification and thus the worst-case timing scenario, the memory device 100 can optimize use of the data latches 485 when the timing delay is $t_{CCD\_S}$ between consecutive access operations. In these embodiments, the different data propagation timings over the local data buses 487 and 488 are not a concern for sequences access operations with longer timing specifications (e.g., the timing delay $t_{CCD\_L}$) than the timing delay $t_{CCD\_L}$ because the optimization provides an adequate amount of time to transfer data off of the local data buses 487 and 488 (e.g., to isolate the data) between consecutive data transfers. As discussed above, the sequences of access operations that are provided the longer timing specifications include (i) read-to-read sequences of access operations to the same memory bank group, as shown in FIG. 3A; (ii) write-to-write sequences of access operations to the same memory bank group, as shown in FIG. 3B; and/or (iii) read-to-write and/or write-to-read sequences of access operations to the same or different memory bank groups. In this manner, the memory device 100 can adhere to conventional timing specifications, such as those illustrated in FIGS. 3A and 3B, and thereby maintain device performance while eliminating and/or minimizing the concern that data transferred during consecutive access operations on the same local data bus will collide with and/or corrupt one another.

Figure 5:
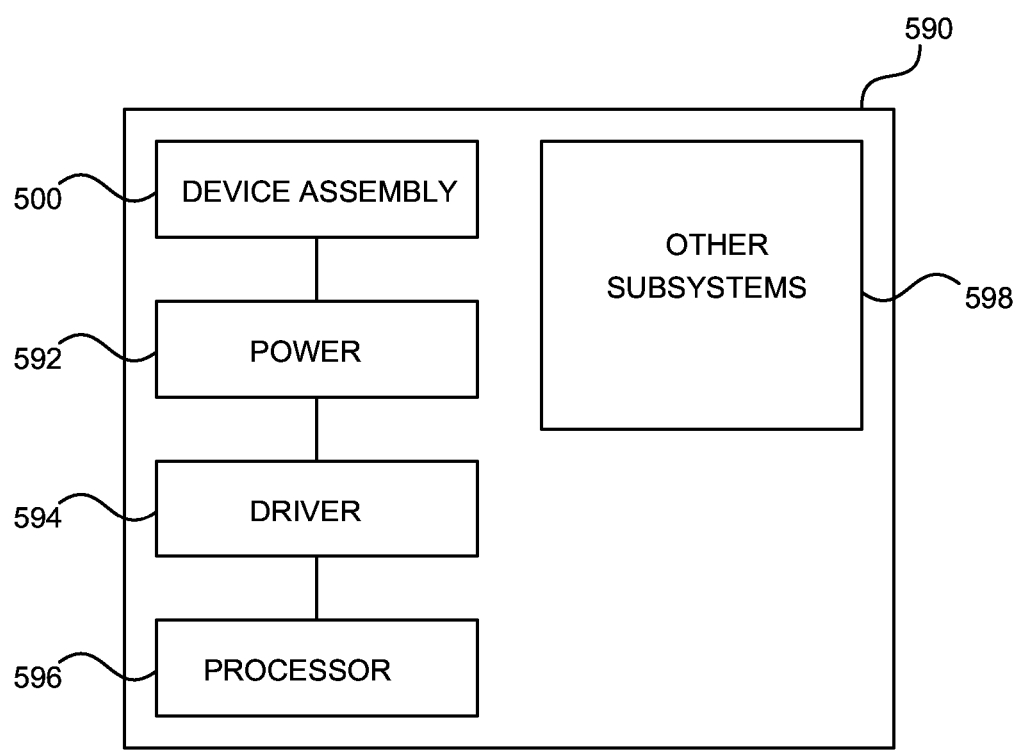
FIG. 5 is a schematic view of a system that includes a memory device configured in accordance with embodiments of the present technology.

FIG. 5 is a schematic view of a system that includes a memory device in accordance with embodiments of the present technology. Any one of the foregoing memory devices described above with reference to FIGS. 1-4 can be incorporated into any of a myriad of larger and/or more complex systems, a representative example of which is system 590 shown schematically in FIG. 5. The system 590 can include a semiconductor device assembly 500, a power source 592, a driver 594, a processor 596, and/or other subsystems and components 598. The semiconductor device assembly 500 can include features generally similar to those of the memory device described above with reference to FIGS. 1-4, and can, therefore, include various features of memory content authentication. The resulting system 590 can perform any of a wide variety of functions, such as memory storage, data processing, and/or other suitable functions. Accordingly, representative systems 590 can include, without limitation, hand-held devices (e.g., mobile phones, tablets, digital readers, and digital audio players), computers, vehicles, appliances, and other products. Components of the system 590 may be housed in a single unit or distributed over multiple, interconnected units (e.g., through a communications network). The components of the system 590 can also include remote devices and any of a wide variety of computer readable media.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, although steps are presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," "having," and "with" are used throughout to mean including at least the recited feature(s) such that any greater number of the same feature and/or additional types of other features are not precluded.

From the foregoing, it will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

We claim:

1. A memory device, comprising:
   a memory array including two or more memory bank groups;
   I/O gating circuitry;
   a local data bus electrically coupling the I/O gating circuitry to the two or more memory bank groups; and
   one or more data latches electrically coupled to the local data bus,
   wherein—
      the local data bus includes a plurality of array data lines shared between the two or more memory bank groups,
      the plurality of shared array data lines is configured to transfer data between the I/O gating circuitry and each of the two or more memory bank groups,
      data transferred over the plurality of shared array data lines between the I/O gating circuitry and a first memory bank group in the two or more memory bank groups has a first propagation delay,
      data transferred over the plurality of shared array data line between the I/O gating circuitry and a second memory bank group in the two or more memory bank groups has a second data propagation delay different than the first propagation delay,
      the memory device is configured to match column select generations for the first and the second memory bank groups with the first and the second propagation delays, and
      the data latches are configured to transfer first data corresponding to a first access operation off of the local data bus to free up the local data bus to transfer second data corresponding to a second access operation.

2. The memory device of claim 1, wherein the first and the second access operations are read operations, and wherein the first and the second data are first read data and second read data, respectively.

3. The memory device of claim 2, wherein the first access operation is a read operation directed to the first memory bank group, and wherein the second access operation is a read operation directed to the second memory bank group.

4. The memory device of claim 2, wherein the one or more data latches are positioned at an edge of the memory array, and wherein the one or more data latches are configured to transfer the first read data off of the local data bus when the first read data exits the memory array.

5. The memory device of claim 1, wherein the first and the second access operations are write operations, and wherein the first and the second data are first write data and second write data, respectively.

6. The memory device of claim 5, wherein the first access operation is a write operation directed to the first memory bank group, and wherein the second access operation is a write operation directed to the second memory bank group.

7. The memory device of claim 5, wherein the one or more data latches are positioned at one or more locations proximate the two or more memory bank groups within the memory array, and wherein the one or more data latches are configured to transfer the first write data off of the local data bus when the first write data arrives at the one or more locations.

8. The memory device of claim 1, wherein—
the first memory bank group is positioned a first distance away from the I/O gating circuitry; and
the second memory bank group is positioned a second distance greater than the first distance away from the I/O gating circuitry such that the second data propagation delay is greater than the first data propagation delay.

9. The memory device of claim 1, wherein—
the memory device is configured to receive a clock signal;
a timing delay between the first and the second access operations is $t_{CCD\_S}$; and
$t_{CCD\_S}$ is equivalent to four to eight cycles of the clock signal.

10. The memory device of claim 1, wherein the plurality of shared data lines of the local data bus includes a maximum of 64 array I/O data lines and a maximum of eight array data mask lines.

11. The memory device of claim 1, wherein—
the two or more memory bank groups are a first set of memory bank groups;
the memory device further comprises:
a second set of memory bank groups including two or more memory bank groups different than the two or more memory bank groups of the first set of memory bank groups, and
a second local data bus different than the first local data bus; and
the second local data bus electrically couples the second set of memory bank groups to the I/O gating circuitry.

12. The memory device of claim 1, wherein the memory device is a dynamic random access memory (DRAM) device.

13. A memory system, comprising:
a host device; and
a memory device including—
a memory array including two or more memory bank groups;
I/O gating circuitry;
a local data bus electrically coupling the I/O gating circuitry to the two or more memory bank groups; and
one or more data latches electrically coupled to the local data bus,
wherein—
the local data bus includes a plurality of array data lines shared between the two or more memory bank groups,
the plurality of shared array data lines is configured to transfer data between the I/O gating circuitry and each of the two or more memory bank groups,
data transferred over the plurality of shared array data lines between the I/O gating circuitry and a first memory bank group in the two or more memory bank groups has a first propagation delay,
data transferred over the plurality of shared array data line between the I/O gating circuitry and a second memory bank group in the two or more memory bank groups has a second data propagation delay different than the first propagation delay,
the memory device is configured to match column select generations for the first and the second memory bank groups with the first and the second propagation delays, and
the data latches are configured to transfer first data corresponding to a first access operation off of the local data bus to free up the local data bus to transfer second data corresponding to a second access operation.

14. The memory system of claim 13, wherein—
the memory device is configured to receive a clock signal;
a timing delay between the first and the second access operations is $t_{CCD\_S}$; and
$t_{CCD\_S}$ is equivalent to four to eight cycles of the clock signal.

15. The memory system of claim 13, wherein the first access operation is directed to the first memory bank group, and wherein the second access operation is directed to the second memory bank group.

16. The memory system of claim 13, wherein—
the first memory bank group is positioned a first distance away from the I/O gating circuitry; and
the second memory bank group is positioned a second distance greater than the first distance away from the I/O gating circuitry such that the second data propagation delay is greater than the first data propagation delay.

17. An input/output (I/O) circuit for a memory device, the I/O circuit comprising:
I/O gating circuitry;
a local data bus having a plurality of array data lines configured to electrically couple the I/O gating circuitry to two or more memory bank groups in the memory device, the plurality of data lines including—
a plurality of array input/output (I/O) data lines; and
a plurality of array data mask lines; and
one or more data latches electrically coupled to the local data bus,
wherein—
each of the array data lines in the plurality of array data lines is configured to be shared between the two or more memory bank groups,
the plurality of array data lines is configured to transfer data between the I/O gating circuitry and each of the two or more memory bank groups,
data transferred over the plurality of array data lines between the I/O gating circuitry and a first memory bank group in the two or more memory bank groups has a first propagation delay, data transferred over the plurality of shared array data lines between the I/O gating circuitry and a second memory bank group in the two or more memory bank groups has a second data propagation delay different than the first propagation delay, and the data latches are configured to isolate first data corresponding to a first data transfer off of the local data bus to free up the local data bus to transfer second data corresponding to a second data transfer.

18. The I/O circuit of claim 17, wherein the plurality of array data lines includes a maximum of 64 array I/O data lines and a maximum of eight array data mask lines.

19. The I/O circuit of claim 17, wherein the memory device is a dynamic random access memory (DRAM) device.

* * * * *